United States Patent [19]

Hollmann

[11] Patent Number: 4,989,171
[45] Date of Patent: Jan. 29, 1991

[54] DATA PROCESSING METHOD AND APPARATUS FOR CALCULATING A MULTIPLICATIVELY INVERTED ELEMENT OF A FINITE FIELD

[75] Inventor: Hendrik D. L. Hollmann, Eindhoven, Netherlands

[73] Assignee: U.S. Philips Corporation, New York, N.Y.

[21] Appl. No.: 420,844

[22] Filed: Oct. 12, 1989

[30] Foreign Application Priority Data

Oct. 18, 1988 [EP]  European Pat. Off. ......... 88202324.5

[51] Int. Cl.$^5$ .............................................. G06F 7/00
[52] U.S. Cl. .................................. 364/746.1; 364/754
[58] Field of Search ............... 364/746.1, 746, 754; 371/37

[56] References Cited

U.S. PATENT DOCUMENTS

| | | | |
|---|---|---|---|
| 4,037,093 | 7/1977 | Gregg et al. ...................... | 364/746.1 |
| 4,162,480 | 7/1979 | Berlekamp .................... | 364/746.1 X |
| 4,538,240 | 8/1985 | Carter et al. .................. | 364/746.1 X |
| 4,697,248 | 9/1987 | Shirota ......................... | 364/746.1 X |
| 4,745,568 | 5/1988 | Onyszchuk et al. .......... | 364/746.1 X |
| 4,797,848 | 1/1989 | Walby ......................... | 364/746.1 X |
| 4,800,515 | 1/1989 | Hori et al. ..................... | 364/746.1 |

OTHER PUBLICATIONS

Wang et al., "VLSI Architectures for Computing Multiplications and Inverses in GF $(2^m)$", IEEE Trans. on Computer, vol. C-34, No. 8, Aug. 1985, pp. 709-717.

Primary Examiner—Dale M. Shaw
Assistant Examiner—Tan V. Mai
Attorney, Agent, or Firm—Anne E. Barschall

[57] ABSTRACT

There is described the calculation of a multiplicatively inverted element of an input vector specified in a finite major Galois field. From the set of vector coefficients there is formed a first set of linear forms and a further set of matrix-organized linear forms. The elements of the first set of linear forms are pairwise combined to quadratic forms that represent a set of coefficients of a vector defined in a subfield in the major field. This latter vector is then converted to its multiplicative inverse, after which the inverted subfield-vector has its coefficients multiplied by elements of the further set to generate the multiplicative inverse in the major field. By scrupulously combining the generation of various intermediate terms a further reduction of the necessary hardware and/or processing time is attained.

3 Claims, 5 Drawing Sheets $$x^{-1} = (x^{-1}{}_0, x^{-1}{}_1, \ldots, x^{-1}{}_{2n-1}) \in GF(2^{2n})$$

```
            MACRO
MACRO       INV         I(I7,I6,I5,I4,I3,I2,I1,I0)
#                       O(J7,J6,J5,J4,J3,J2,J1,J0)
*
D01         QNOR2       I(C1,C3)
D02         QNAND2      I(D05,C3)
D03         QNOR2       I(D04,C0)
D04         QIN1        I(C1)
D05         QIN1        I(C2)
D06         QXNOR       I(C0,C1)
D07         QNOR2       I(D09,C2)
D08         QF08        I(D01,D02,D03,D06,D07)
D09         QIN1        I(C3)
D0          QIN2        I(D08)
*
```

```
D10     QF06      I(D11,C1,C0,C2)
D11     QIN1      I(C3)
D12     QIN1      I(C0)
D13     QAND3     I(D12,C1,C2)
D14     QNOR2     I(C1,C2)
D15     QNOR3     I(D14,D12,C3)
D16     QNOR3     I(D10,D13,D15)
D1      QIN2      I(D16)
*
D20     QXNOR     I(C2,C3)
D21     QNOR2     I(D20,D23)
D22     QIN1      I(C0)
D23     QNOR2     I(D22,C1)
D25     QNAND2    I(C0,C1)
D26     QNOR2     I(D25,C3)
D2A     QIN1      I(C1)
D27     QAND4     I(D2A,C0,C2,C3)
D28     QNOR3     I(D21,D26,D27)
D2      QIN2      I(D28)
*
D30     QNAND2    I(C1,C2)
D31     QNAND3    I(D30,C0,C3)
D32     QNAND2    I(C0,C3)
D33     QNAND3    I(D32,C1,C2)
D34     QOR3      I(C1,C2,C3)
D35     QNAND3    I(D31,D33,D34)
D3      QIN2      I(D35)
*
N47     QXNOR     I(I4,I7)
N67     QXNOR     I(I6,I7)
N37     QXNOR     I(I3,I7)
N56     QXNOR     I(I5,I6)
N06     QXNOR     I(I0,I6)
N05     QXNOR     I(I0,I5)
N45     QXNOR     I(I4,I5)
N15     QXNOR     I(I1,I5)
N35     QXNOR     I(I3,I5)
N25     QXNOR     I(I2,I5)
N24     QXNOR     I(I2,I4)
N13     QXNOR     I(I1,I3)
*
A15     QIN1      I(N15)
A47     QIN1      I(N47)
A06     QIN1      I(N06)
A37     QIN1      I(N37)
A13     QIN1      I(N13)
A45     QIN1      I(N45)
A24     QIN1      I(N24)
*
N7      QIN1      I(I7)
N1457   QXNOR     I(N15,N47)
N0567   QXNOR     I(N05,N67)
A256    QXNOR     I(N25,I6)
N357    QXNOR     I(N35,N7)
N0367   QXNOR     I(N06,N37)
N1345   QXNOR     I(N13,N45)
N2456   QXNOR     I(N24,N56)
*
```

FIG. 2B

```
A1457   QIN1    I(N1457)
A0567   QIN1    I(N0567)
A357    QIN1    I(N357)
A0367   QIN1    I(N0367)
A1345   QIN1    I(N1345)
A2456   QIN1    I(N2456)
*
N02     QXNOR   I(I0,I2)
N03     QXNOR   I(I0,I3)
N17     QXNOR   I(I1,I7)
N26     QXNOR   I(I2,I6)
AA37    QXOR    I(I3,I7)
A46     QXOR    I(I4,I6)
A36     QXOR    I(I3,I6)
A57     QXOR    I(I5,I7)
AA57    QXOR    I(I5,I7)
N34     QXNOR   I(I3,I4)
*
A34     QIN1    I(N34)
A02     QIN1    I(N02)
A26     QIN1    I(N26)
*
A123    QXOR    I(A13,I2)
A245    QXOR    I(A45,I2)
A267    QXOR    I(A26,I7)
A345    QXOR    I(A45,I3)
A0156   QXOR    I(A06,A15)
A0234   QXOR    I(A02,A34)
N1234   QXNOR   I(A13,A24)
A1234   QIN1    I(N1234)
A2467   QXOR    I(A26,A47)
A2567   QXOR    I(A26,A57)
N02345  QXNOR   I(A0234,I5)
A02345  QIN1    I(N02345)
A01237  QXOR    I(A02345,A1457)
A02356  QXOR    I(A123,A0156)
A02456  QXOR    I(A2456,I0)
A12345  QXOR    I(A1234,I5)
A12456  QXOR    I(A267,A1457)
A13456  QXOR    I(A256,A1234)
A14567  QXOR    I(A1457,I6)
A024567 QXOR    I(A0567,A24)
A034567 QXOR    I(A0567,A34)
A134567 QXOR    I(A1234,A2567)
A123456 QXOR    I(A267,A1345)
*
NN25    QXNOR   I(I2,I5)
B25     QXNOR   I(I2,I5)
BB25    QXNOR   I(I2,I5)
B256    QXNOR   I(BB25,I6)
*
N0      QIN2    I(I0)
N4      QIN1    I(I4)
N5      QIN1    I(I5)
*
NC01    QNAND2  I(N0,I4)
NC02    QNAND2  I(N02,N0567)
NC03    QNOR2   I(B25,I3)
NC04    QNAND2  I(N1457,I6)
```

FIG. 2C

```
        *
NJ51    QNAND2    I(D0,I5)
NJ52    QNAND2    I(D1,A1345)
NJ53    QNAND2    I(D2,A256)
NJ54    QNAND2    I(D3,A2467)
        *
NJ61    QNAND2    I(D0,A13456)
NJ62    QNAND2    I(D1,I4)
NJ63    QNAND2    I(D2,A0234)
NJ64    QNAND2    I(D3,A1457)
        *
NJ71    QNAND2    I(D0,A2567)
NJ72    QNAND2    I(D1,A02345)
NJ73    QNAND2    I(D2,A37)
NJ74    QNAND2    I(D3,A123)
        *
J012    QXNOR     I(NJ01,NJ02)
J034    QXNOR     I(NJ03,NJ04)
NJ0     QXNOR     I(J012,J034)
J0      QIN1      I(NJ0)
        *
J112    QXNOR     I(NJ11,NJ12)
J134    QXNOR     I(NJ13,NJ14)
NJ1     QXNOR     I(J112,J134)
J1      QIN1      I(NJ1)
        *
J212    QXNOR     I(NJ21,NJ22)
J234    QXNOR     I(NJ23,NJ24)
NJ2     QXNOR     I(J212,J234)
J2      QIN1      I(NJ2)
        *
J312    QXNOR     I(NJ31,NJ32)
J334    QXNOR     I(NJ33,NJ34)
NJ3     QXNOR     I(J312,J334)
J3      QIN1      I(NJ3)
        *
J412    QXNOR     I(NJ41,NJ42)
J434    QXNOR     I(NJ43,NJ44)
NJ4     QXNOR     I(J412,J434)
J4      QIN1      I(NJ4)
        *
J512    QXNOR     I(NJ51,NJ52)
J534    QXNOR     I(NJ53,NJ54)
NJ5     QXNOR     I(J512,J534)
J5      QIN1      I(NJ5)
        *
J612    QXNOR     I(NJ61,NJ62)
J634    QXNOR     I(NJ63,NJ64)
NJ6     QXNOR     I(J612,J634)
J6      QIN1      I(NJ6)
        *
J712    QXNOR     I(NJ71,NJ72)
J734    QXNOR     I(NJ73,NJ74)
NJ7     QXNOR     I(J712,J734)
J7      QIN1      I(NJ7)
        MEND
```

FIG. 2E

```
NC11    QNOR2    I(I3,I4)
NC12    QNAND2   I(N03,B256)
NC13    QNAND2   I(B25,N26)
NC14    QNAND2   I(N17,N357)
*
NC21    QNAND2   I(N5,AA37)
NC22    QNOR2    I(NN25,A46)
NC23    QNOR2    I(I6,I7)
NC24    QNOR2    I(N0367,N1345)
*
NC31    QNAND2   I(N0,I5)
NC32    QNOR2    I(NN25,N4)
NC33    QNOR2    I(A36,AA57)
NC34    QNOR2    I(N17,N2456)
*
C012    QXNOR    I(NC01,NC02)
C034    QXNOR    I(NC03,NC04)
NC0     QXNOR    I(C012,C034)
C0      QIN3     I(NC0)
*
C112    QXNOR    I(NC11,NC12)
C134    QXNOR    I(NC13,NC14)
NC1     QXNOR    I(C112,C134)
C1      QIN3     I(NC1)
*
C212    QXNOR    I(NC21,NC22)
C234    QXNOR    I(NC23,NC24)
NC2     QXNOR    I(C212,C234)
C2      QIN3     I(NC2)
*
C312    QXNOR    I(NC31,NC32)
C334    QXNOR    I(NC33,NC34)
NC3     QXNOR    I(C312,C334)
C3      QIN3     I(NC3)
*
NJ01    QNAND2   I(D0,A024567)
NJ02    QNAND2   I(D1,A14567)
NJ03    QNAND2   I(D2,A1234)
NJ04    QNAND2   I(D3,A267)
*
NJ11    QNAND2   I(D0,A34)
NJ12    QNAND2   I(D1,A134567)
NJ13    QNAND2   I(D2,A034567)
NJ14    QNAND2   I(D3,A01237)
*
NJ21    QNAND2   I(D0,A12345)
NJ22    QNAND2   I(D1,A123456)
NJ23    QNAND2   I(D2,A0156)
NJ24    QNAND2   I(D3,A345)
*
NJ31    QNAND2   I(D0,A12456)
NJ32    QNAND2   I(D1,A02356)
NJ33    QNAND2   I(D2,A0567)
NJ34    QNAND2   I(D3,A02456)
*
NJ41    QNAND2   I(D0,A2456)
NJ42    QNAND2   I(D1,A0367)
NJ43    QNAND2   I(D2,A357)
NJ44    QNAND2   I(D3,A245)
```

FIG. 2D

DATA PROCESSING METHOD AND APPARATUS FOR CALCULATING A MULTIPLICATIVELY INVERTED ELEMENT OF A FINITE FIELD

BACKGROUND TO THE INVENTION

The invention relates to calculating the multiplicative inversion of a Galois field element in $GF(q^m)$, when this element is provided in vectorial representation. Herein, q is a prime raised to an exponent, usually, but not exclusively being $q=2^r=2$. For many applications, m' is even and often equal to $m=8$. Such calculations then represent byte-wise data processing for purposes of cryptography, error protection such as by means of Reed-Solomon codes, fast Fourier transform, and others. The data then corresponds to video data, audio data wherein a -Compact Disc- or -Digital Audio Tape- recording audio sample would be constituted by two bytes, or measuring results. As reference the U.S. Pat. No. 4,587,627 is called upon. Hereinafter elementary properties and calculatory operations in a Galois field are considered standard knowledge. Generally, any Galois field element may be inverted by means of a translation table (PROM or ROM), which for reasonable fields, such as $GF(2^8)$ requires a very extensive amount of hardware, inasmuch for each of $2^8$ different possible input combinations an 8-bit output were required. An alternative method using, for example, a programmed processor would require heavy pipelining and in consequence, much computational delay. The present invention uses the concept of subfields and in particular, calculates the multiplicative inverse of a vectorially represented element of a finite field, the major field, by means of inversion in a subfield of the major field. Now, a finite field $GF(q^m)$ contains $GF(q^n)$ as a subfield if $m=rn$, wherein for disclosing the present invention, an example is described wherein $r=2$. However, the principle of the invention is just as well applicable to other values of r. The index of the major field over the subfield is r. Now, inasmuch as a calculation in a subfield operates on fewer vector coefficients than a corresponding operation in the major field, the former calculation is easier and/or faster.

SUMMARY TO THE INVENTION

Among other things, it is an object of the present invention to provide a data processing method and apparatus for calculating a multiplicatively inverted element in a finite field, which method operates fast with limited hardware requirement by using inversions in a subfield, in particular, a subfield of index 2, by means of sensibly combining quadratic forms playing a part in that reduction, to standard forms. According to one aspect thereof, such object is realized by a method for calculating a multiplicative inverse of an input element of a finite, major field that contains a subfield of index 2, so that the major field contains a quadratically larger number of elements than the subfield, the method comprising the steps of:

a. receiving the input element X as represented by a first set of vector components $(X0, X1 \ldots X2n-1)$, wherein n is the dimension of the major field;
b. from said first set generating a second set of binary linear forms $Lij(X)$, wherein $i=0 \ldots n-1$ and $j=1 \ldots 2n$ and a third set of matrix organized linear forms $wlk(X)$, wherein $l=0 \ldots 2n-1$, $k=0 \ldots n-1$, by means of selective EXCLUSIVE-ORing of said components;
c. pairwise combining elements of said second set by fieldwise multiplication for generating a third set of quadratic forms and combining such quadratic forms by means of EXCLUSIVE-ORing for generating a fourth set of quadratic forms as representing corresponding further vector coefficients $Q0(X) \ldots Qn-1(X)$ in said subfield;
d. inverting in the subfield a subvector represented by said further vector coefficients to an inverted subvector;
e. multiplying components of said inverted subvector by respective elements of said third set of linear forms to by means of addition of products acquired by said multiplying generating components of said multiplicative inverse.

The invention also relates to an apparatus for calculating such multiplicative inverse of an input element of a major Galois field that is received in vectorial representation. Such apparatus could represent a subsystem of a "compact disc" decoder or other data processing apparatus. Further advantageous aspects of the invention are recited in dependent Claims.

BRIEF DESCRIPTION OF THE FIGURES

Hereinafter, the invention will be disclosed more extensively, first the mathematical aspects thereof, then the resulting operational sequence of steps and hardware circuitry, and finally a particular example, with reference to the accompanying Figures, wherein:

FIG. 1 is an elementary block diagram of an apparatus according to the invention.

FIGS. 2a-2e are Tables 1A-1E, respectively, which tables are a gate listing of an inversion device for $GF(2^8)$.

MATHEMATICAL FORMULATION OF THE INVENTION

Figures 1, 2A:
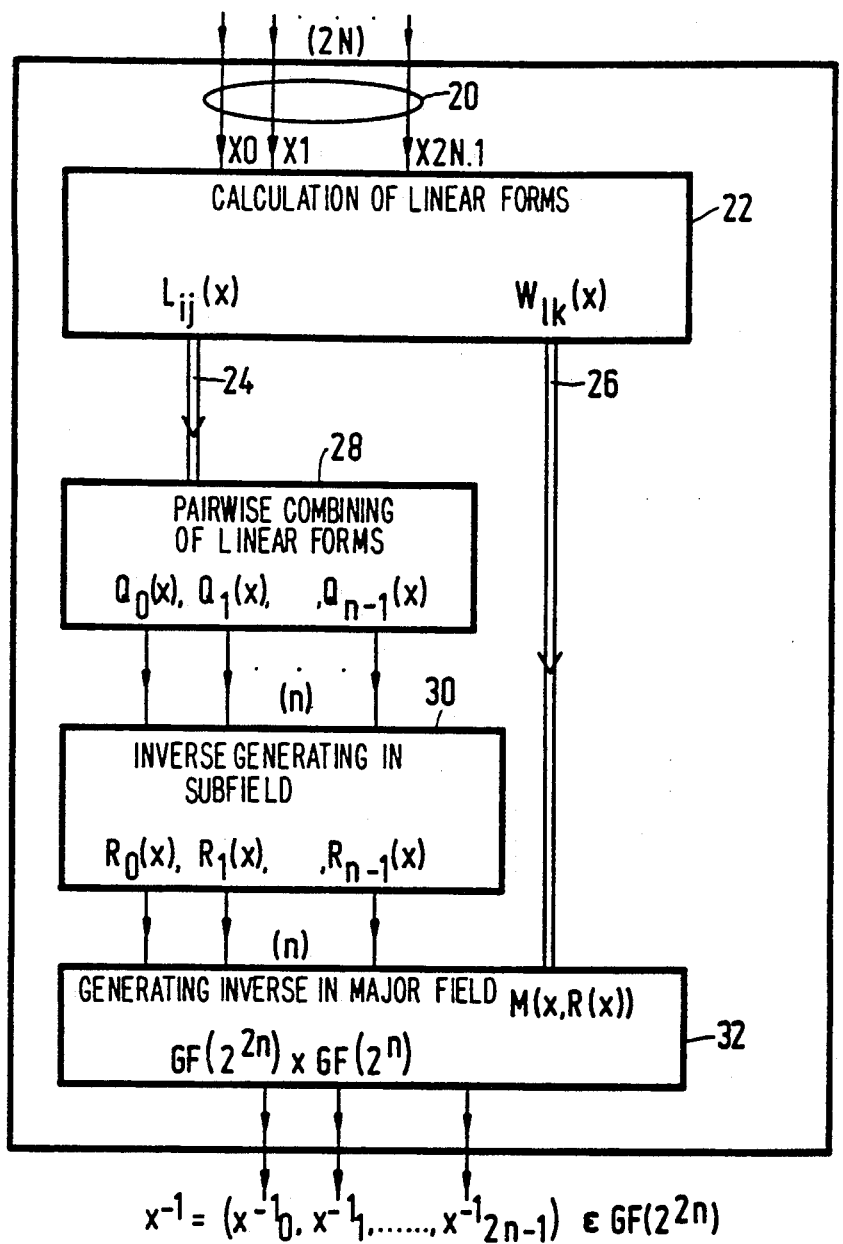

For reasons of simplicity, the invention is described for the finite field $GF(2^m)$, wherein $m=2n$. The case $q=3$ would instead of bits lead to three-valued elements that may, in principle, be realized by means of known logic circuitry. The major field $GF(2^m)$ has for $m=8$ for example a generating polynomial $g(X)=X^8+X^4+X^3+X^2+1$. Its elements are expressed with respect to a standard base $(1, d \ldots d^7)$, given by the solutions of $g(d)=0$. The starting point of the invention is to compute the multiplicative inverse element $X^{-1}$ of an element X, determined in $GF(2^m)$ by $X \cdot X^{-1} = 1$, by using the expression: $X^{-1}=(X^{2n+1})^{-1} \cdot X^{2n}$. Herein, the bracketed expression is an element of the subfield, whereas X is an element of the major field.

We define a linear form $L(X)$ over $GF(2^m)$ as a function $L(X)=L0 \cdot X0 + L1 \cdot X1 + \ldots + Lm-1 \cdot Xm-1$, from $GF(2^m)$ to $GF(2)$, wherein each $Li$ is an element of $GF(2)$. Such linear form as herein defined is a modulo 2 sum of selected coefficients of the vector representation of X. A quadratic form $Q(X)$ over $GF(2^m)$ from $GF(2^m)$ to $GF(2)$ is defined as a function:

$$Q(X) = \sum_{i=0}^{m-1} ci \cdot Xi + \sum_{i<j} aij \cdot Xi \cdot Xj,$$

wherein $ci, aij \in GF(2)$. Herein, -E- means -is an element of-. Therefore, such quadratic form as herein defined is a modulo 2 sum of selected coefficients and selected, ANDED coefficient pairs of the vector representation of X. In roughly similar way, higher degree forms could be defined.

Now, for $L(X)=X^{2n}$ and $Q(X)=X^{2n+1}$, wherein $X \in GF(2^{m=2n})$, $L(X)$ can be written as $L(X)=(L0(X), \ldots Lm-1(X))$, with respect to some base in $GF(2^m)$ that need not be the standard base $(1 \ldots d^{m-1})$ which had been fixed according to some standardization convention. Herein each coefficient $Li(X)$ is a linear form. In fact, for $X, Y \in GF(2^m)$, $(X+Y)^2 = X^2 + 2XY + Y^2 = X^2 + Y^2$, because $XY+XY=0$ and also $(X+Y)^{2n} = X^{2n} + Y^{2n}$. Thus, the transition from X to $L(X)$ is a linear operation and each $Li(X)$ is a linear form.

Now, for $X \in GF(2^m)$, $Q(X)$ is in $GF(2^n)$. In fact, the elements X of $GF(2^m)$ satisfy $X^{2m}=X$. Moreover, the elements Y of $GF(2^n)=GF(2^m)$ are exactly those that satisfy $Y^{2n}=Y$. Now, $(Q(X))^{2n} = X^{22n+2n} = X^{22n}.X^{2n} = X.X^{2n} = Q(X)$. For a base $b0, b1 \ldots bn-1$ in $GF(2^n)$, $Q(X)$ may be written as $Q(X)=(Q0(X), Q1(X), \ldots, Qn-1(X))$, the choice of the base influencing the values of the coefficients.

Now, each coefficient $Qj(X)$ is a quadratic form. In fact, for $B(X,Y)=Q(X+Y)+Q(X)+Q(Y)$, obviously $B(X,Y)=(X^{2n}+Y^{2n})(X+Y)+X^{2n+1}+Y^{2n+1}=X^{2n}.Y+X.Y^{2n}=L(X).Y+X.L(Y)$, so that $B(X,Y)$ indeed defines a bilinear operation. This proves the statement on $Qj(X)$.

FINDING REPRESENTATIONS OF THE LINEAR AND QUADRATIC FORMS $Lj(X), Qk(X)$

Now, for given basis $\alpha 0 \ldots \alpha m-1$ in $GF(2^m)$ and $\beta 0 \ldots \beta n-1$ in $GF(2^n)$ there exist straightforward ways for computing expressions for the linear forms $Li(X)$, $i=0 \ldots m-1$ and quadratic forms $Qj(X)$, $j=0 \ldots n-1$ mentioned earlier. Thus, such computing may be effected automatically, by means of a computer program.

For all i,j, we have $\alpha i.\alpha j^{2n} + \alpha i^{2n}.\alpha j \in GF(2^n)$; $\alpha i^{2n+1} \in GF(2^n)$; $\alpha i^{2n} \in GF(2^m)$. Whereas, for all i,j:

$$\alpha i^{2n} = \sum_{j=0}^{m-1} cij \cdot \alpha j, \quad \alpha i^{2n+1} = \sum_{k=0}^{n-1} bik \cdot \beta k; \text{ and}$$

$$\alpha i \cdot \alpha j^{2n} + \alpha i^{2n} \cdot \alpha j = \sum_{k=0}^{n-1} aijk \cdot \beta k,$$

for certain numbers $cij, bik, aijk \in GF(2)$. Therefore, $$L(X) = X^{2n} = \left(\sum_{i=0}^{m-1} Xi \cdot \alpha i\right)^{2n} = \sum_{i=0}^{m-1} Xi \cdot \alpha i^{2n} = \sum_{i=0}^{m-1} \sum_{j=0}^{m-1} Xi \cdot cij \cdot \alpha j, \text{ and}$$

$$Q(X) = X^{2n+1} = \left(\sum_i Xi \cdot \alpha i\right)^{2n+1} =$$

$$\left(\sum_i Xi \cdot \alpha i^{2n}\right) \cdot \left(\sum_j Xj \cdot \alpha j\right) = \sum_i \alpha i^{2n+1} Xi +$$

$$\sum_{i<j} Xi \cdot Xj \cdot (\alpha i \cdot \alpha j^{2n} + \alpha i^{2n} \cdot \alpha j) =$$

$$\sum_i \sum_k Xi \cdot bik \cdot \beta k + \sum_{i<j} \sum_k Xi \cdot Xj \cdot aijk \cdot \beta k.$$

As a result:

$$Lj(X) = \sum_{i=0}^{m-1} cij \cdot Xi \ (j=0 \ldots m-1)$$

$$Qk(X) = \sum_{i=0}^{m-1} bik \cdot Xi + \sum_{i<j} aijk \cdot Xi \cdot Xj \ (k=0 \ldots n-1).$$

In sequel to the above, the quadratic forms so defined can be reexpressed in more manageable representation. Now, consider $M(X,Y)$, defined as $(X^{2n}.Y)$, wherein $X \in GF(2^m)$ and $Y \in GF(2^n)$. Herein, $$Y = \sum_k YK \cdot \beta k \cdot \text{Therefore,}$$

$$M(X,Y) = \sum_j \sum_k Lj(X) \cdot Yj \cdot \alpha j \cdot \beta k.$$

Write $\alpha j \cdot \beta k = \sum_l djkl \cdot \alpha l$

Then we find $$M(X,Y) = \sum_j \sum_k \sum_l Lj(X) \cdot Yk \cdot djkl \cdot \alpha l$$

$$= \sum_{l=0}^{2n-1} \alpha l \left\{\sum_{k=0}^{n-1} Yk \cdot \sum_{i=0}^{2n-1} Xi \cdot \left(\sum_{j=0}^{2n-1} cij \cdot djkl\right)\right\}$$

Put $wlk(X) = \sum_{i=0}^{2n-1} Xi \cdot \sum_{j=0}^{2n-1} cij \cdot djkl$

Now, it can be proven, that $wlk(X)$ is a linear form over $GF(2^m)$. Consequently, $M(X,Y)$ has components $(0 \ldots m-1)$:

$$\sum_{k=0}^{n-1} Yk \cdot wlk(X) \ (l=0, 1 \ldots m-1)$$

Now, let a function $L(X)$ from $GF(2^m)$ to $GF(2)$ be called essentially linear, if either $L(X)$ itself, or $1+L(X)$ is a linear form. It turns out that the following is true. For $Q(X)$ to be a quadratic form over $GF(2^m)$, it is possible to find essentially linear forms $Li(X)$, such that $$Q(X) = L1(X).L2(X) + L2(X).L3(X) + \ldots + L2k-1(X).L2k(X), \text{ or } L1(X) \ldots L2k(X) + 1,$$

where the required number $2k$ of such linear forms needed for $Q(X)$ is governed only by the number of zeroes of $Q(X)$ on $GF(2^m)$. It has been found that the number of zeroes of the quadratic forms $Qi(X)$ is equal to $1+(2^n+1)(2^{n-1}-1)$, and independent of the bases $(\alpha j)$ in $GF(2^{2n})$ and $(\beta j)$ in $GF(2^n)$ actually used. In fact, such zero would be generated for $x^{2n+1}=y^{2n+1}$, which in the case if either $X=Y=0$, or $(X/Y)^{2n+1}=1$. In fact, for $\alpha$ being a primitive element in $GF(2^m)$, the equation $Z^{2n+1}=1$ has exactly $2^n+1$ solutions $Zj=\alpha^{j(2n-1)}$ for $j=0, \ldots 2^n$. As a consequence, $Q(X)=X^{2n+1}$ assumes each value different from zero exactly $2^{n+1}$ times. Since $Q(X) \in GF(2^n)$, $GF(2^{2n})$ has $2^{2n}$ elements, and $GF(2^n)$ has $2^n$ elements, $Q(X)$ assumes each value in $GF(2^n)$ different from zero exactly $2^n+1$ times and the value zero exactly once. Now if Y runs through all elements of $GF(2^n)$, each coefficient of Y with respect to some fixed base will, for reasons of symmetry be 0 exactly half the number of cases. So any particular coefficient of all non-zero elements in $GF(2^n)$ will be zero exactly $2^{n-1} - 1$ times.

The number 2k of essentially linear forms necessary for the expressions for the quadratic forms $Qi(X)$ is determined by the number of zeroes a quadratic form $Q(X)$ over $GF(2^n)$, to wit: $1+(2^k+1)+(2^{k-1}-1)$. Essentially linear forms thus give the quadratic form as:

$$Qi(X) = Li.1(X).Li.2(X) + \ldots + Li.2n-1(X).Li.2n(X).$$

RESUME OF THE RESULTS FORMULATED AS A SEQUENCE OF STEPS

According to the foregoing, the multiplicative inverse is to be calculated as follows:

$$X^{-1} = X^{2n+1} \cdot X^{2n}.$$

Herein, $$L(X): = X^{2n} \in GF(2^m),$$
$$Q(X): = X^{2n+1} \in GF(2^n).$$

First, two bases are chosen, to wit:
$GF(2^m)$: $\alpha 0, \alpha 1 \ldots \alpha 2n-1$
$GF(2^n)$: $\beta 0, \beta 1 \ldots \beta n-1$.
In particular the choice for the second basis is arbitrary. Expressed in the first basis, $L(X)=((L0(X), \ldots L2n-1(X))$, wherein the coefficients are linear forms which, however, not be calculated explicitly. Furthermore, $Q(X)=(Q0(X) \ldots Qn-1(X))$, wherein the coefficients are quadratic forms. Note that the basis can be chosen freely for the second Galois field.

Now the first object is to calculate $R(X)=(R0(X) \ldots Rn-1(X))$, which is the inverse of $Q(X)$ in the subfield $GF(2^n)$. Then the following product is calculated:

$$L(X) \cdot R(X) =$$

$$\left( \sum_{i=0}^{2n-1} Xi \cdot \alpha i \right)^{2n} \cdot \sum_{j=0}^{n-1} Rj(X) \cdot \beta j =$$

$$\sum_{i=0}^{2n-1} Xi \cdot \alpha i^{2n} \cdot \sum_{j=0}^{n-1} Rj(X) \cdot \beta j \text{ (because } Xi = 0, 1) =$$

$$\sum_{i=0}^{2n-1} \sum_{j=0}^{n-1} (Xi \cdot Rj(X)) \cdot \alpha i^{2n} \cdot \beta j \text{ (because } Rj = 0, 1) =$$

$$\sum_{i=0}^{2n-1} \sum_{j=0}^{n-1} (Xi \cdot Rj(X)) \cdot \sum_{k=0}^{2n-1} dijk \cdot \alpha k =$$

$$\sum_{k=0}^{2n-1} \left\{ \sum_{j=0}^{n-1} Rj(X) \cdot \left[ \sum_{i=0}^{2n-1} dijk \cdot Xi \right] \right\} \alpha k.$$

Define the linear form $$wjk(X) = \sum_{i=0}^{2n-1} dijk \cdot Xi.$$

These are the linear forms that must be calculated in particular.

In conclusion, the k-th component of the inverse quantity to be sought, is given by $$\underline{X}^{-1}k = \sum_{j=0}^{n-1} Rj(X) \cdot wjk(X).$$

Now, from $Rj(X)(j)$ the quantity $Qj(X)(j)$ must be produced. In the foregoing, it has been found that $$Qj(X) = \sum_{i=0}^{n-1} Lj.2i(X) \cdot Lj.2i + 1(X),$$

wherein the quantities $Lj, \ldots$ are linear forms. In consequence, the following quantities must be produced:
$Ljs(X)$, for $s=0 \ldots 2n-1$, $j=0 \ldots n-1$
$wjk(X)$, for $k=0 \ldots 2n-j$, $j=0 \ldots n-1$.

As shown in the examples, infra, certain parts of these calculations can be combined. Next, the quantities $Qj(X)$ are formed, which together give the quantity $Q(X)$. Thereafter, the inverse of $Q(X)$, called $R(X)$ is calculated in the subfield, by means of its coefficients $Rj(X)$. This calculation generally will be done in the classical way. Alternatively, the subfield-inversal could still be split into a further inversion in a secondary subfield. Finally, the coefficients of the inverse value in the major field are given by the expression for $\underline{X}^{-1}k$.

DESCRIPTION OF A HARDWARE EMBODIMENT

FIG. 1 is an elementary block diagram of an apparatus according to the invention. On a first level the various subsystems are only described as blocks. These may be realized either as hardwired logic for ultrafast operation on a single Galois field, such as has been defined for the HIFI audio Compact Disc System, such as for effecting error correction on the basis of cross-interleaved Reed-Solomon codes and other signal treatment features. Alternatively, the various blocks could be realized by means of program control of more generally, applicable processor blocks, such as an 8-bit microprocessor. In the latter case, time-sharing of various blocks among a plurality of functions would still be feasible and decrease chip area, and/or give other advantages. Of course processing power versus operational speed are considered for a trade-off. The latter realization would still represent an improvement on the longer pipelining necessary for direct inversion in the major field. Moreover, there is no explicit limitation to operating in only a single major Galois field, and interchanges among various fields and/or various bases for corresponding field would be perfectly feasible. For brevity, further description of such standard building blocks is omitted.

Now, in the circuitry, input 20 carries the 2n bits of the input quantity in parallel. In block 22 the calculation of the linear forms $Lij(X)$ and $wlk(X)$ takes place, either category producing $2n^2$ linear forms. In the case of wild logic, the gate depth of the arrangement is at most $(1+k)$, wherein $k=\log_2(n)$ or the next higher integer. Thus for Compact Disc, $k=3$. In the above, the effect of combining calculations for the L and the w quantities has not been considered. The linear forms $Lij(X)$ are output on interconnection 24 towards block 24; the linear forms $wlk(X)$ on output 26 directly to block 32. The bit width of the interconnections 24, 26 has not been shown explicitly.

In block 28 the linear forms are pairwise combined and added to produce the quantities $Qi(X)$, with $i=0 \ldots n-1$, all additions being executed modulo-2. This requires a total of $n^2$ AND operations and $n(n-1)$ XOR operations to a logic gate depth of $1+k$. The result is outputted as an n-bit wide quantity to block 30.

In block 30 the inverse quantity $R(X) = Q(X)^{-1}$ is calculated in the subfield $GF(2^n)$, for example by means of a programmed table memory. The result is outputted as an n-bit wide quantity to block 32.

In block 32 the inverse in the subfield is received and also the linear forms $wLk(X)$ for calculating the expression:

$$\underline{X}^{-1} = M(X, R(X))1 = R0(X) \cdot W10(X) + \ldots + Rn-1(X) \cdot W1, n-1(X),$$

wherein $l = 0 \ldots 2n-1$. This operation requires in total $2n^2$ AND operations and $2n(n-1)$ XOR operations, with a total logical gate depth of $(k+1)$. The total number of operations is $8n^3 - n^2 - 3n$ XOR operations which for reasonable values of $n$ ($\geq 4$) is approximately $8n^3$. Furthermore $3n^2$ AND operations are necessary that in view of the more simple structure of the AND operations, is rather negligible. The total logic depth is $3 + 3k$.

Now, the structure of the above conversions may be fixed, but there is still an appreciable freedom as regards the precise realization. Even in case the base in the major field has been specified, the following options still exist:
a. choice of the base $\beta 0 \ldots n-1$ in $GF(2^n)$. This choice influences the linear forms $wlk(X)$, the quadratic forms $Qi(X)$, and thus also the linear forms $Lij(X)$;
b. even after fixing the choice of base $(\beta 0 \ldots \beta n-1)$ in $GF(2^n)$ the representations for $Qi(X)$ as products of essentially linear forms, i.e. the precise formulation of the linear forms $Lij(X)$ is open to choice.

In particular, the second choice may be advantageous. In many cases, the linear forms $Lij(X)$ may be chosen such that each only involves at most n of the coefficients (instead of $2n$). In this case the logic depth is reduced by 1 and the number of XOR's for calculating the $Lij(X)$ is halved. Moreover, various intermediate results may be shared among the respective calculations, both for the computation of the quantities $Lij(X)$ and of the quantities $wlk(X)$ for reducing the number of XOR-operations still further. In fact, the number of XOR-operations need to be only $(1 \ldots 1\frac{1}{2}) \cdot n^3$. If both bases $\alpha$ and $\beta$ are open to choice, it is suggested to choose a normal base. In that case, exactly the same hardware can be used to calculate each of the coefficients of the inverse. The overall structure of the hardware would then become more regular. Alternatively, if the coefficients of the inverse may be computed sequentially, the same hardware may be used for each of those coefficients in succession.

EXAMPLE OF EXECUTING THE METHOD

Hereinafter, as an example an inversion in $GF(2^4)$ is described: $m = 2n = 4$. The finite field $GF(2^4)$ is generated by the irreducible polynomial $g(X) = X^4 + X + 1$ over $GF(2)$. Let $\alpha$ be a formal zero of $g(X)$, thus: $\alpha^4 = \alpha + 1$. As a base in $GF(2^4)$ we take: $(1, \alpha, \alpha^2, \alpha^3)$. Now, $GF(2^4)$ contains $GF(2^2)$. Indeed the elements of $GF(2^2)$ are writeable as $\{0, 1, \alpha^5, \alpha^{10}\}$. As a base in $GF(2^2)$ the normal base $(\alpha^5, \alpha^{10})$ is chosen.

The vector to be inverted is now:

$$X = (X0, X1, X2, X3) = X0 + X1\alpha + X2\alpha^2 + X3\alpha^3.$$

Write $Q(X) = Q0(X)\alpha^5 + Q1(X)\alpha^{10}$. This directly leads to the expressions for the only two quadratic forms needed now, $$Q0(X) = X0 + X1 + X3 + X0X1 + X0X2 + X1X2 + X1X3$$

$$Q1(X) = X0 + X2 + X3 + X0X1 + X0X2 + X0X3 + X2X3.$$

Herein, use is made of the expression $Q(X) = X^{2n+1}$, which is then resolved to its basic elements.

The inverse of element $Y1\alpha^5 + Y2\alpha^{10}$ can in this simple subfield directly be written as $Y2\alpha^5 + Y1\alpha^{10}$, so that $R1(X) = Q0(X)$ and $R0(X) = Q1(X)$. In a larger subfield the inversion itself by means of a table-ROM would be conventional. Computation of the forms $wlk(X)$ now leads to:

$$X0^{-1} = R0 \cdot (X2) + R1 \cdot (X0 + X1 + X3)$$

$$Xn^{-1} = R0 \cdot (X0 + X1) + R1 \cdot (X0 + X3)$$

$$X2^{-1} = R0 \cdot (X0 + X2 + X3) + R1 \cdot (X0)$$

$$X3^{-1} = R0 \cdot (X1 + X2) + R1 \cdot (X1 + X2 + X3).$$

An alternative representation for $Q0(X)$, $Q1(X)$ is the following:

$$Q0(X) = 1 + (X0 + X1) \cdot (X2) + \overline{(X0 + X3)} \cdot \overline{(X1)}$$

$$Q1(X) = 1 + \overline{(X0 + X1)} \cdot \overline{(X3)} + \overline{(X0 + X3)} \cdot (X1 + X2).$$

Herein, the bracketed expressions represent essentially linear forms, the overstrike denoting the inverse logical value. The subterms are used several times and can be shared, by means of:

$$\begin{aligned} a1 &= X0 + X1 & a4 &= a1 + X3 = X0 + X1 + X3 \\ a2 &= X0 + X3 & a5 &= a2 + X2 = X0 + X2 + X3 \\ a3 &= X1 + X2 & a6 &= a3 + X3 = X1 + X2 + X3. \end{aligned}$$

The number of EXOR-additions required is much less than the upper bound specified earlier: $4n^2(2n-1) = 48$.

In a bigger major field, and therefore bigger associated subfield, the computations involve more quantities and in consequence the necessary gates have more inputs and also the logic depth is greater. All taken together, the principle of the calculation is the same and is effected along the general approach lines described earlier.

DESCRIPTION OF A PREFERRED EMBODIMENT

Tables 1A–1E give a tabular representation for a preferred embodiment for inversion in the Compact Disc Galois field, $GF(2^8)$. The standard number of gates would be of order $4n^2(2n-1) = 448$. The gate representation is in three columns. The first column lists the name of the gate, which is also used as a name of output signal of the gate. The second column lists the function of the gate. The third column lists the input-signals of the gate in question. The top two lines of table 1A define the eight components (I7 ... I0) of the input vector, and the eight components (J7 ... J0) of the output vector that is the multiplative inverse of the input vector.

Now, 35 D-gates effect the inversion in the subfield that in itself in fact corresponds to a table look-up. This inversion uses as input signals various C... signals to be discussed hereinafter, and also various intermediate signals produced in the inversion array itself. The gate library has the following elements used in the present inversion:

QNOR2 is a two-input NOR-gate
QNAND2 is a two-input NAND-gate
QIN1 is a one-input inverter
QIN2 is a one-input inverter with larger fan-out
QAND3 is a three-input AND-gate
QNOR3 is a three-input NOR-gate
QAND4 is a four-input AND-gate
QNAND3 is a three-input NAND-gate
QXNOR is a two-input EXCLUSIVE-NOR-gate
QOR3 is a three-input OR-gate
QIN3 is a one-input invertor with still larger fan-out
QFO6 is a first special function expressed as follows for a sequence of four input signals a1 ... a4: (a1+a2+a3.a4)
QFO8 is a second special function expressed as follows for a sequence of five input signals a1 ... a5: (a1+a2.a3+a4.a5).

Further elements of the library are not specified for brevity.

Now, in block 22 of FIG. 1 the various linear forms are calculated. This is effected by means the set of gates starting with gate N47 up to B256 (or up to gate N5). These forms are only EXCLUSIVE-OR-gates, EX-CLUSIVE-NOR-gates and inverters. In block 28 the quadratic forms are calculated. This is effected by means of the set of gates starting with gate NCO1 up to gate C3. Thereafter, the necessary vector components C0 ... C3 are ready for processing in block 30. After the inversion in the subfield has been effected to produce the vector components D0 ... D3, the multiplication in block 32 is effected. This is realized by means of the gates starting with gate NJO1.

The total gate count is now

| | |
|---|---|
| block 22: | 76 |
| block 28: | 32 |
| block 30: | 35 |
| block 32: | 64 |
| total: | 207. |

OVERVIEW

For enhanced clarity, the following brief overview of the method followed hereinbefore is presented. The final result should be $X^{-1}k$, that is, the k-th component of the inverse vector=

$$\sum_{j=0}^{n-1} Rj(X) \cdot wjk(X). \quad (A)$$

To get $Rj(X)$ $(j=0 ... n-1)$ we had to calculate the quadratic form $Qj(X)$ $(j=0 ... n-1)$. To this effect we wrote:

$$Qj(X) = \sum_{j=0}^{n-1} Lj, 2i(X) \cdot Lj, 2i+1(X), \quad (B)$$

both L's being linear forms. In fact, we had to calculate the linear forms
$Ljs(X)$ $s=0 ... 2n-1$, $j=0 ... n-1$
$wjk(X)$ $k=0 ... 2n-1$, $j=0 ... n-1$.

$Qj(X)$ follows from equation (B), yielding $Q(X)$. $Rj(X)$ $(j=0 ... n-1)$ is found by inverting $Q(X)$. Finally $X^{-1}k$ follows from equation (A).

I claim:

1. A method for calculating a multiplicative inverse of an input element of a finite, major field that contains a subfield of index 2, the major field containing a quadratically larger number of elements than the subfield, the method comprising the steps of:
   a. receiving the input element X as represented by a first set of vector components $(X0, X1 ... X2n-1)$, wherein n is the dimension of the major field;
   b. from said first set generating a second set of binary linear forms $Lij(X)$, wherein $i=0 ... n-1$ and $j=1 ... 2n$, and a third set of matrix organized linear forms $wlk(X)$, wherein $l=0 ... 2n-1$, $k=0 ... n-1$, by means of selective EXCLUSIVE-ORing of said vector components;
   c. pairwise combining elements of said second set by fieldwise multiplication for generating a fourth set of quadratic forms and combining such quadratic forms by means of EXCLUSIVE-ORing for generating a fifth set of quadratic forms as representing corresponding further vector coefficients $Q0(X) ... Qn-1(X)$ in said subfield;
   d. inverting in the subfield a subvector represented by said further vector coefficients to an inverted subvector; and
   e. multiplying components of said inverted subvector by respective elements of said third set of matrix organized linear forms to, by means of addition of products acquired by said multiplying, generate components of said multiplicative inverse.

2. Apparatus for receiving an input element of a major finite field that contains a subfield of index 2, the major field of dimension 2n thereby containing a quadratically larger number of elements than the subfield, and from said input element calculating a multiplicative inverse element thereof, said device comprising:
   a. an input (2) for receiving said input element in vector representation $(X0 ... 2n-1)$;
   b. a linear form generator fed by said input for generating on the basis of said vector representation a first array of binary linear forms $Lij(X)$, wherein $i-0 ... n-1$ and $j=1 ... 2n$, for presentation on a first output (24) and a second matrix array of binary linear forms $wLk(X)$ wherein $L-0 ... 2n-1$, $k=0 ... n-1$ for presentation on a second output (26);
   c. a quadratic form generator (28) fed by said first output for pairwise combining elements of said first array in field multiplication to form a result array and EXCLUSIVE-ORing said result array to form a third array of quadratic forms $Q0(X) ... Qn-1(X)$, $Q0(X) ... Qn-1(X)$ being a second vector representation in said subfield;
   d. an invertor (30) fed by said quadratic form generator for receiving said second vector representation and inverting said second vector representation in said subfield to form an inverted subvector; and
   e. a matrix evaluator (32) fed by said invertor to receive said inverted subvector and by said second output to receive said second array and, by means of multiplying components of said inverted subvector by respective elements of said second matrix array of binary linear forms and addition of products acquired by said multiplying, generating components of said multiplicative inverse.

3. An apparatus as claimed in claim 2, wherein said input is 2n bits wide, said matrix evaluator having a further output that is 2n bits wide.

* * * * *